United States Patent [19]
Hong et al.

[11] Patent Number: 5,821,174
[45] Date of Patent: Oct. 13, 1998

[54] PASSIVATION LAYER OF SEMICONDUCTOR DEVICE AND METHOD FOR FORMING THE SAME

[75] Inventors: Kwon Hong; Young Jung Kim, both of Kyoungki-do, Rep. of Korea

[73] Assignee: Hyundai Electronics Industries Co., Ltd., Ichon, Rep. of Korea

[21] Appl. No.: 883,039

[22] Filed: Jun. 26, 1997

[30] Foreign Application Priority Data

Jun. 27, 1996 [KR] Rep. of Korea ............ 96-24259

[51] Int. Cl.⁶ .................................................. H01L 10/10
[52] U.S. Cl. ..................... 438/788; 438/958; 438/761; 438/785; 438/622; 438/763
[58] Field of Search ..................................... 438/958, 761, 438/785, 622, 763

[56] References Cited

U.S. PATENT DOCUMENTS

| | | | |
|---|---|---|---|
| 3,615,947 | 10/1971 | Yamada | 438/702 |
| 4,217,570 | 8/1980 | Holmes | 338/308 |
| 4,952,904 | 8/1990 | Johnson et al. | 257/757 |
| 5,340,775 | 8/1994 | Carruthers et al. | |
| 5,424,095 | 6/1995 | Clark et al. | |

*Primary Examiner*—Charles L. Bowers, Jr.
*Assistant Examiner*—T. Nguyen
*Attorney, Agent, or Firm*—Reid & Priest LLP

[57] ABSTRACT

A passivation layer of semiconductor device, which comprises a chrome oxide on a silicon nitride or both on and beneath a silicon nitride. The chrome oxide is deposited in a physical vapor deposition technique, relieving the compressive stress of the silicon nitride so as to prevent cracks from occurring therein.

6 Claims, 1 Drawing Sheet

PASSIVATION LAYER OF SEMICONDUCTOR DEVICE AND METHOD FOR FORMING THE SAME

BACKGROUND OF THE INVENTION

1. Field of the Invention

The present invention relates to a passivation layer of a semiconductor device and to a method for forming the same. More particularly, the present invention is concerned with the use of a chrome oxide in preventing the occurrence of cracks in the passivation layer, and a method therefor.

2. Description of the Prior Art

Generally, in fabricating a semiconductor device, a desired circuit is materialized on a semiconductor wafer in the uppermost layer on which a metal wire as a conductive wire is formed, and a passivation layer is formed over the resulting structure, with the aim of excluding the external chemical, physical and optical influences from circuit materialized on the wafer.

Usually, a stacking structure consisting of a silicon oxide and a silicon nitride is widely employed as the passivation layer. The reason for such a structure is that the silicon oxide is relatively easy to deposit while the silicon nitride is so dense that it can exclude the external influences with its relatively thin thickness. For stacking the silicon oxide and the silicon nitride, a plasma enhanced chemical vapor deposition (PECVD) technique is typically used.

It is obvious that, as the passivation layer is thicker, it has greater ability to endure mechanical and chemical attacks from the outside. However, since the silicon nitride deposited on the silicon oxide receives much compressive stress, there is a tendency to generate cracks if the silicon nitride is deposited to a thickness more than the critical value.

Conventionally, in order to avoid the occurrence of such cracks in the silicon nitride, when it is deposited, the deposition process is carried out within such a safe thickness range as not to crack. Thus, the silicon nitride cannot be deposited to a sufficient thickness by such conventional technique.

SUMMARY OF THE INVENTION

An objective of the present invention to overcome the above problems encountered in prior arts and to provide a method for forming a passivation layer of semiconductor device, whereby the occurrence of cracks in a silicon nitride can be minimized with the aid of a chrome oxide deposited in a physical vapor deposition manner.

Another objective of the present invention to provide a passivation layer of semiconductor device, which shows superior ability to protect the semiconductor circuit from external influences.

The chrome oxide on the silicon nitride is superior in corrosion resistance, so that it can minimize the damage to the device from external influences, caused by, for example, moisture penetration.

In addition, since a thin film formed by a physical vapor deposition technique has a characteristic of tensile stress, the chrome oxide, if deposited by the physical vapor deposition technique, is in a complementary relation with the silicon nitride which shows a compressive stress, relieving it.

BRIEF DESCRIPTION OF THE DRAWINGS

Other objectives and aspects of the invention will become apparent from the following description of embodiments with reference to the accompanying drawings in which.

DETAILED DESCRIPTION OF THE PREFERRED EMBODIMENTS

Figure 1:
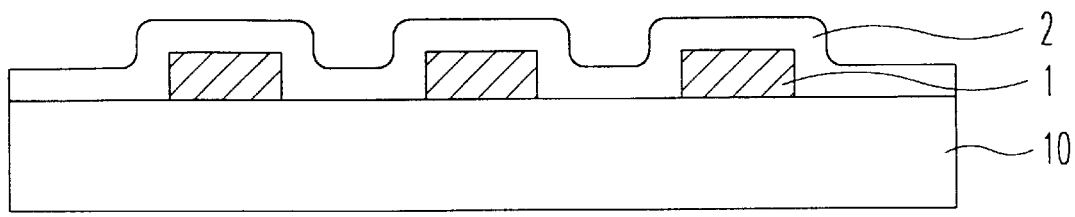
FIGS. 1 to 3 are schematic cross sectional views showing processes for forming a passivation layer of a semiconductor device, in accordance with the present invention.

The application of the preferred embodiments of the present invention is best understood with reference to the accompanying drawings, wherein like reference numerals are used for like and corresponding parts, respectively.

Figure 2:
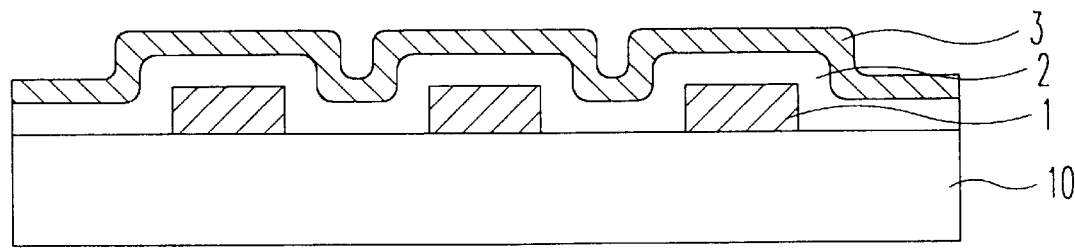
Figure 3:
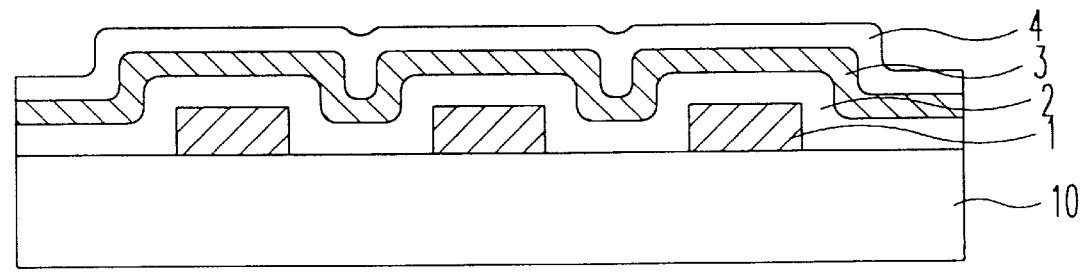

Referring to FIGS. 1 to 3, processes for forming a triplicate layer structure in which a silicon oxide, a silicon nitride and a chrome oxide are, in sequence, laminated, in accordance with a first embodiment of the present invention are shown stepwise.

First, as shown in FIG. 1, a semiconductor substrate 10 on which a semiconductor structure (not shown) is fabricated and metal wires 1 as conductive wires are formed atop the semiconductor structure is prepared. Thereafter, using a chemical vapor deposition technique, a silicon oxide 2 is deposited to a thickness of 500 to 3000 Angstrom for use as the bottom of a passivation layer structure.

FIG. 2 is a cross section illustrating a silicon nitride 3 after it is deposited on the silicon oxide 2 to a thickness of 1000 to 3000 Angstrom using a chemical vapor deposition technique.

FIG. 3 is a cross section illustrating a chrome oxide ($Cr_2O_3$) 4, which is superior in corrosion resistance, after it is deposited on the silicon nitride 3 to a thickness of 1000 to 3000 Angstrom using a physical vapor deposition technique. In accordance with the present invention, this technique is carried out at a power of 1–15 Kw in a reactor heated to 100°–400° C. under a pressure of 1–20 mTorr providing $O_2$ at a flow rate of 10–50 standard cubic centimeter (sccm).

In accordance with a second embodiment of the present invention, a chrome oxide is provided on and beneath the silicon nitride. That is, a passivation layer according to the second embodiment of the present invention consists of a tetraplicate structure in which a silicon oxide, a chrome oxide, a silicon nitride and a chrome oxide are laminated in sequence.

In this embodiment, the silicon oxide and the silicon nitride are deposited in the same manner as that of the first embodiment. As to the chrome oxide, its thickness ranges from 1000 to 2000 Angstrom upon deposition on the silicon nitride and from 100 to 1000 Angstrom upon deposition beneath the silicon nitride. The same deposition technique as that of the first embodiment is used under the same conditions.

As described hereinbefore, the chrome oxide(s) on the silicon nitride or both on and beneath the silicon nitride serves to prevent moisture from penetrating from the outside into the device, giving rise to a significant improvement in the reliability of semiconductor device. In addition, when being formed by a physical vapor deposition technique, the chrome oxide, which is superior in corrosion resistance, relaxes the compressive stress of the silicon nitride to prevent the occurrence of cracks in the silicon nitride, thereby making a passivation layer thick.

Many modifications and variations of the present invention are possible in light of the above teachings. Therefore, it is to be understood that within the scope of the appended claims, the invention may be practiced in ways other than those specifically described.

What is claimed is:

1. A method for forming a passivation layer of semiconductor device, comprising the steps of:

depositing a silicon oxide;

depositing a silicon nitride on the silicon oxide;

depositing a chrome oxide on the silicon nitride in a physical vapor deposition technique.

2. A method in accordance with claim 1, wherein said silicon oxide is 500–3000 Angstrom thick.

3. A method in accordance with claim 1, wherein said silicon nitride is 1000–3000 Angstrom thick.

4. A method in accordance with claim 1, wherein said chrome oxide is 1000–3000 Angstrom thick.

5. A method in accordance with claim 1, wherein said chrome oxide is deposited at a power of 1–15 Kw in a reactor heated to 100°–400° C. under a pressure of 1–20 mTorr providing $O_2$ at a flow rate of 10–50 standard cubic centimeter (sccm).

6. A method in accordance with claim 1, further comprising the step of depositing a chrome oxide on said silicon oxide to a thickness of 100 to 1000 Angstrom by use of a physical vapor deposition technique.

* * * * *